United States Patent [19]
Benedetto

[11] Patent Number: 5,825,832
[45] Date of Patent: Oct. 20, 1998

[54] METHOD AND DEVICE FOR THE RECEPTION OF SIGNALS AFFECTED BY INTER-SYMBOL INTERFACE

[75] Inventor: Valter Benedetto, Fiano, Italy

[73] Assignee: Cselt- Centro Studi E Laboretori Telecomunicazioni S.P.A., Torino, Italy

[21] Appl. No.: 578,032

[22] Filed: Dec. 26, 1995

[30] Foreign Application Priority Data

Feb. 17, 1995 [IT] Italy .................................. TO95A0114

[51] Int. Cl.⁶ ............................. H03D 1/00; H04L 27/06
[52] U.S. Cl. .......................................... 375/341; 371/43.7
[58] Field of Search .................................. 375/341, 262, 375/348; 371/43.7

[56] References Cited

PUBLICATIONS

Sundberg, Generalizations of the Viterbi Algorithm with Applications to Mobile Radio Systems, 1992 IEEE International Conference on Selected Topics in Wireless Communications, pp. 11–14.

Nill et al., Viterbi Algorithms with List and Soft Symbol Output: Extensions and Comparisons, IEEE Global Telecommunications Conference, vol. 2 of 4, pp. 788–792, 1993.

Li et al., Optimum Soft–output Detection for Channels with Intersymbol Interference, IEEE Transactions on Information Theory, vol. 41, No. 3, pp. 704–713, May 1995.

*Primary Examiner*—Stephen Chin
*Assistant Examiner*—Betsy L. Deppe
*Attorney, Agent, or Firm*—Herbert Dubno

[57] ABSTRACT

For the reception of TCM modulated signals a receiver is used which comprises two cascaded Viterbi decoders. The first decoder operates according to a soft output Viterbi algorithm (SOVA), and its output comprises a hard decision on the transmitted symbols as well as a reliability parameter. The output of the first decoder, which is intended essentially to take into account the memory effects of the channel by contrasting the influence of inter-symbol interference, is fed, possibly after a de-interleaving action, to the second Viterbi decoder which carries out the actual decision. The preferred application is to digital communication systems such as microwave radio links.

8 Claims, 7 Drawing Sheets

METHOD AND DEVICE FOR THE RECEPTION OF SIGNALS AFFECTED BY INTER-SYMBOL INTERFACE

SPECIFICATION

1. Field of the Invention

The invention described herein generally refers to transmission of digital signals, and more particularly to the transmission, over channels with memory, of digital signals coded with a coded modulation representable by a trellis diagram and affected by inter-symbol interference: Hereinafter, as an example of such modulation, TCM modulation (Trellis-Coded Modulation) shall be considered extensively. However, even if such modulations often are referred to as trellis coded modulations, it is well known that the acronym "TCM" indicates properly only a particular type of the modulations to which the application applies.

2. Description of the Prior Art

As those skilled in the art well know, trellis coded modulation has been the subject of very intense research and innovation activity over the years. The related literature is therefore very ample and rich. For example, for a general overview on TCM modulation, it would be useful to refer to the book by E. Biglieri, D. Divsalar, P. J. McLane and M. K. Simon, "Introduction to Trellis-Coded Modulation with Applications", Macmillan, New York, 1991.

To contrast the effects of inter-symbol interference (ISI) in channels with memory, the use—as a standard solution—of linear and Decision Feedback equalization techniques is known. However, when equalization techniques of this kind are used in conjunction with a TCM modulation, major problems arise. The price of the reduction in inter-symbol interference obtained with a linear equalization is that the noise sequence at the receiver (composed of a so-called Viterbi decoder) is colored, and this entails a loss of performance with respect to the optimal condition. Actually, the noise correlation caused by the equalizer can significantly reduce the effectiveness of the coding, in particular in the case of channels with high attenuation distortion.

When the noise correlation is limited to adjacent samples, it can be eliminated by means of an interleaving technique, at the price of a limited delay. In the presence of channels with high amplitude distortion, an ideal decision feedback equalizer (i.e. one with perfect feedback) can provide, in correspondence with the output of the decoder, a signal-to-noise ratio noticeably higher than a linear equalizer. On the other hand, the decision feedback is penalized by the high decoding delay introduced by the Viterbi algorithm.

To overcome these problems, it is possible—at least in principle—to utilize an optimum receiver comprising a Viterbi decoder operating on the basis of a trellis diagram which takes into account the memory of both the decoder and the channel. However, the number of states in such a trellis would in practice be so high as to make the solution impractical in terms of computational burden and speed. Consequently, different techniques have been studied that use a sub-optimal approach with respect to such a solution, with the purpose of reaching a reasonable complexity at the cost of a modest loss in performance.

Moreover, alternative solutions have been recently proposed for channel equalization. These solutions are based on a technique which can be defined as blind identification. In particular, the work by E. Biglieri, G. Caire, and G. D'Aria "Blind identification of terrestrial microwave radio links", IEEE Globecom '93, Houston, Tex., November-December 1993, discusses the application of the aforesaid techniques to the equalization of digital radio links affected by selective fading. That paper compares two equalization schemes, i.e. a cascade equalizer and an interference-cancelling device that exploits information conveyed by the data (data-aided processing). Such a solution allows the channel to appear, after compensation, as a memoryless channel, so that the metric (Euclidean distances) seen by the Viterbi equalizer is close to the optimal situation if the cancelling device operates properly.

Otherwise stated, this strategy is based on cancellation of the interference affecting the received signal, prior to calculating the metric for the Viterbi decoder which decodes the TCM scheme. Cancellation is accomplished by taking preliminary decisions on the received symbols and by feeding with such decisions a cancellation device which generates a copy of the intersymbol interference samples to be subtracted from the received signal. This cancellation concept was originally derived for non-linear channels. The mentioned work, however, makes no reference to the presence of coded signals, for example according to a TCM scheme.

An additional approach is the one that can be defined "per-survivor processing", as described, for example, in the paper by R. Raheli, A. Polydoros, C. K. Tzou "The principle of per-survivor processing: a general approach to approximate and adaptive MLSE", Proceedings of Globecom '91, pp. 1120–1124, Phoenix, Ariz., Dec. 2–5, 1991. The idea on which this solution is based is to incorporate, in the structure of the Viterbi decoder, the data-aided estimation of unknown parameters, here represented by interference starting from adjacent symbols. Essentially, it is a method which reduces the number of states which would be required in the optimal sequence estimation. As in the Viterbi algorithm, in correspondence with each step, the states describe all the possible values assumed by a finite number $\mu$ of previous inputs.

While in the optimal detection $\mu$ is equal to channel memory length plus the length of the TCM encoder memory, it is possible to reduce $\mu$ to just the length of the TCM encoder memory. In this way, each state does not provide information on the actual state of the channel. Channel estimation is extracted from the path (the "survivor") which leads to each state. The metric is calculated by utilizing the trellis state which provides information on the state of the channel. Essentially, this solution is similar to decision feedback equalization in that channel estimation is used to estimate the tail of the inter-symbol interference of the received signal.

The difference with respect to the cancellation strategy described above is that, in the cancellation solution, preliminary decisions are required to eliminate inter-symbol decisions, while the per-survivor strategy described uses the symbols connected to the branches of the surviving paths instead of decisions. On the other hand, with the latter strategy, it is only possible to remove the tails of inter-symbol interference in the received signals, whereas it is not possible to deal with the precursors.

OBJECT OF THE INVENTION

The present invention therefore aims to provide a method for the reception of signals affected by inter-symbol interference, in particular signals subjected to a coded modulation, for example in accordance with a TCM scheme, able to overcome the drawbacks recalled above.

SUMMARY OF THE INVENTION

According to the present invention, such a goal is reached by a method for the reception of digital signals which have undergone a coded modulation representable by means of a trellis diagram, and which are transmitted on a channel (F) with memory, so that a received digital signal is affected by inter-symbol interference. The invention comprises the steps of submitting the received digital signal to:

a first Viterbi decoding step, so as to generate a respective soft output $(S_{pk}, S_{qk})$I including, for each symbol, a pair of components comprising a decision on the transmitted symbol $(\hat{U}_{pk}, \hat{U}_{qk})$, and a reliability parameter $(L_{pk}, L_{qk})$, the first Viterbi decoding step taking into account the effect of the memory of the channel, and a second Viterbi decoding step carried out on the soft output, the second Viterbi decoding step taking into account the coded modulation.

The method can comprise a deinterleaving step of the received signal carried out between the first and second Viterbi decoding steps.

The digital signals can be transmitted by adopting a QAM constellation.

The first Viterbi decoding step can be carried out by deriving, for the respective output, in-phase and quadrature components both for the decision on the transmitted symbol $(\hat{U}_{pk}, \hat{U}_{qk})$, and for the reliability parameter $(L_{pk}, L_{qk})$ The first Viterbi decoding step can include the following operations:

determining the reliability value of the most recent received symbol;

searching the path with the best metric within the trellis of the first Viterbi decoding step;

for any other path of the trellis which leads to the state under examination and for any position within the decision interval, comparing the respective hard decisions and proceeding in such a way that;

i) if the hard decisions on the two paths coincide, new reliability of the symbol belonging to the survivor path are defined, and ii) if the hard decisions on the two paths do not coincide, the reliability values related to the direction along which the two decisions do not coincide are updated, and obtaining the best path which allows identifying the hard decision and the respective reliability values associated with it.

The invention also refers to the related receiver which comprises:

a first Viterbi decoder which receives the digital signal and generates, starting from it, a respective soft output $(S_{pk}, S_{qk})$ including, for each symbol a pair of components comprising $(\hat{U}_{pk}, \hat{U}_{qk})$ and a reliability parameter $(L_{pk}, L_{qk})$, the first Viterbi decoder taking into account the memory effect of such channel, and a second Viterbi decoder fed with the soft output, the second Viterbi decoder taking into account the coded modulation.

The device can comprise a deinterleaving unit connected between the first and second Viterbi decoders.

The device can be configured to receive digital signals coded by adopting a QAM constellation.

Advantageously the first Viterbi decoder derives, for the respective output, in-phase and quadrature components both for the decision on the transmitted signal $(\hat{U}_{pk}, \hat{U}_{qk})$ and for the reliability parameter $(L_{pk}, L_{qk})$.

The first Viterbi decoder can be configured to:

determine the reliability value of the most recent received symbol;

search, within the respective trellis, the path with the best metric;

for any other path of this trellis which leads to the state under examination and for each position within the decision interval, compare the respective hard decisions and to proceed in such a way that:

i) if the hard decisions on the two paths coincide, then new reliabilities of the symbol belonging to the survivor path are defined, and ii) if the hard decisions on the two paths do not coincide, then the reliability values related to the decision along which the two decisions do not coincide are updated; and obtain the best path allowing to identify the hard decision and the respective reliability values associated with it.

THEORETICAL BASES OF THE INVENTION

Synthetically, the solution according to the invention is an evolution of the last two approaches described above, essentially based on the idea of accomplishing, at the reception, in cascade or, in general, in an integrated manner, an action aimed at contrasting the phenomenon of inter-symbol interference and an actual decoding action accomplished by a Viterbi decoder and the related algorithm (currently called VA).

This algorithm and the related decoding structures are widely known to the skilled in the art, thanks also to the extensive literature dedicated to them. Solely to provide an indication, the following reference texts can be mentioned: D. Forney, "The Viterbi Algorithm", Proc. of the IEEE, Vol. 61, No. 3, pp. 268–278, March 1973, and J. Viterbi, J. K. Omura, "Principles of Digital Communication and Coding", McGraw-Hill, New York, 1979.

The following description shall not therefore contain any specific illustration of the operating criteria of a Viterbi decoder, except to the extent required to allow those skilled in the art to realize the invention.

The solution according to the invention essentially utilizes the Soft Output Viterbi Algorithm or SOVA, whereby each decoded symbol is accompanied by a reliability information, which makes it possible to cascade two Viterbi decoders with modest losses with respect to the optimal situation.

The solution known as SOVA is already widely known in the art as shown, for example, by the work by J. H. Hagenauer and P. Hoeher, "A Viterbi algorithm with soft-decision outputs and its applications", IEEE Globecom '89, Dallas, Tex., pp. 47.1.1–47.1.7, November 1989.

The paper by Y. Li, B. Vucetic and Y. Sato, "Optimum soft-output detection for channels with inter-symbol interference", IEEE Information Theory Workshop, Susono, Japan, June 1993, describes a decoding algorithm in which, for each received symbol, a vector is generated which comprises as many components as are the symbols of the constellation used for the transmission. Each component is indicative of the reliability associated to a respective symbol, i.e. of the probability that such symbol has been emitted. The algorithm aims at achieving a Maximum Aposteriori Probability (MAP). In particular, the vector is used to feed an additional Viterbi algorithm which uses, as metrics, the values of the components of the vector itself. This is clearly a rather complex solution, and its level of complexity becomes more and more significant as the cardinality of the constellation of the transmitted symbols increases.

On the contrary, the solution according to the invention exploits the opportunity to know the channel impulse response in a different way. Solely on the basis of the channel memory, a trellis is constructed which is utilized according to the operating criteria of the Viterbi decoder to emit, for each received symbol, a pair of component comprising, respectively, a decision on the transmitted symbol and a measure of the reliability of that decision. These parameters are then fed to another Viterbi decoder, which is tasked with decoding, for example, the TCM scheme. Briefly, the function of the first Viterbi decoder is to present at its output, towards the second Viterbi decoder, a set of signals ideally corresponding with the one that would be present at the output of the communication channel in the absence of inter-symbol interference. This fact is a clear advantage, also because it allows using, as the second Viterbi decoder, any available decoder of this kind, with no need for substantial modifications and/or adjustments.

BRIEF DESCRIPTION OF THE DRAWING

The invention shall now be described, solely by way of non-limiting example, with reference to the accompanying drawing in which.

SPECIFIC DESCRIPTION

Figure 1:
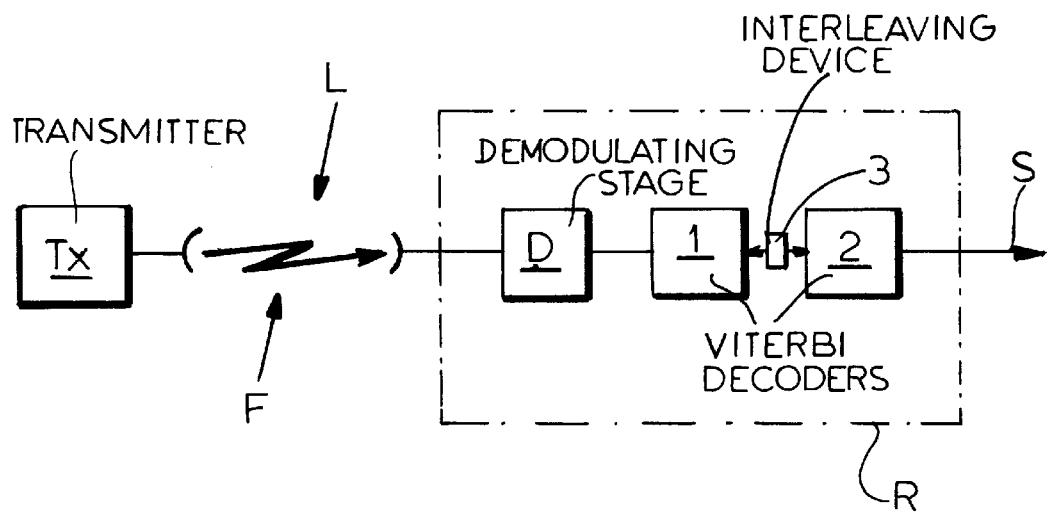
FIG. 1 is a block diagram which shows, in a purposely schematic manner, a link for digital signal transmission where the solution according to the invention is exploited.

In the diagram in FIG. 1, L indicates a digital communication system that may be, for instance, a terrestrial microwave radio link. In purposely schematic terms (a more detailed illustration is not required here for the skilled in the art, especially since these elements are not essential for the purposes of understanding and carrying out the invention), link L can be considered as composed of a transmitter Tx which sends toward a receiver R, over a channel F, a digital signal subjected to a coded modulation, for example according to a TCM scheme.

The transmission can occur on any physical carrier (channel) F. The reference to a microwave radio link is to be seen purely as an example. This also stands with regard to the specific aspects of the generation of the signal sent on carrier F (for instance the radio signal), starting from the original coded signal, and also to the criteria associated with the generation of such coded signal starting from the digital signal to be transmitted. All these aspects express current technique and are well known to those skilled in the art.

By way of reference, also with regard to the performance assessment which will be exposed further on, it is assumed that the transmission occurs according to a TCM scheme having the following characteristics:

constellation: 128 QAM, encoder: eight state 4D-TCM, and number of bits per symbol: 6.5.

Preferably, the encoded symbols undergo interleaving, for instance with a 32×32 transcoding matrix, in order to generate the signal sequence which is transmitted over the channel. The latter is assumed to be affected by intersymbol interference (ISI).

Figure 2:
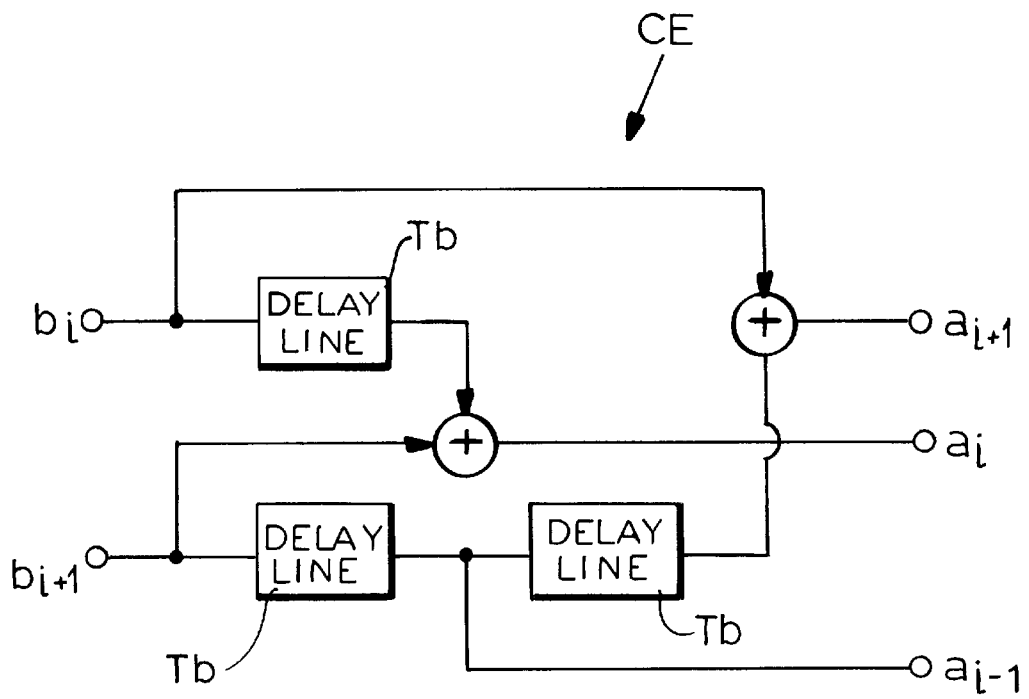
FIG. 2 is a block diagram depicting the structure of a conventional coder which can be utilized to generate a TCM coded signal.

The block diagram in FIG. 2 illustrates the possible structure of a conventional encoder CE (known in se), which can be used to generate, starting from a sequence of input symbols $b_i$ (i=0, 1, . . . ), a sequence of TCM coded output symbols $a_i$ (i=0, 1, . . . ). In the diagram, the blocks labelled as $T_b$ represent delay lines whose delay is equal to the duration of the symbol, while the nodes labelled as "+" are summation nodes. The skilled in the art will appreciate that this is a convolutional encoder of the type r=2/3.

Figure 3:
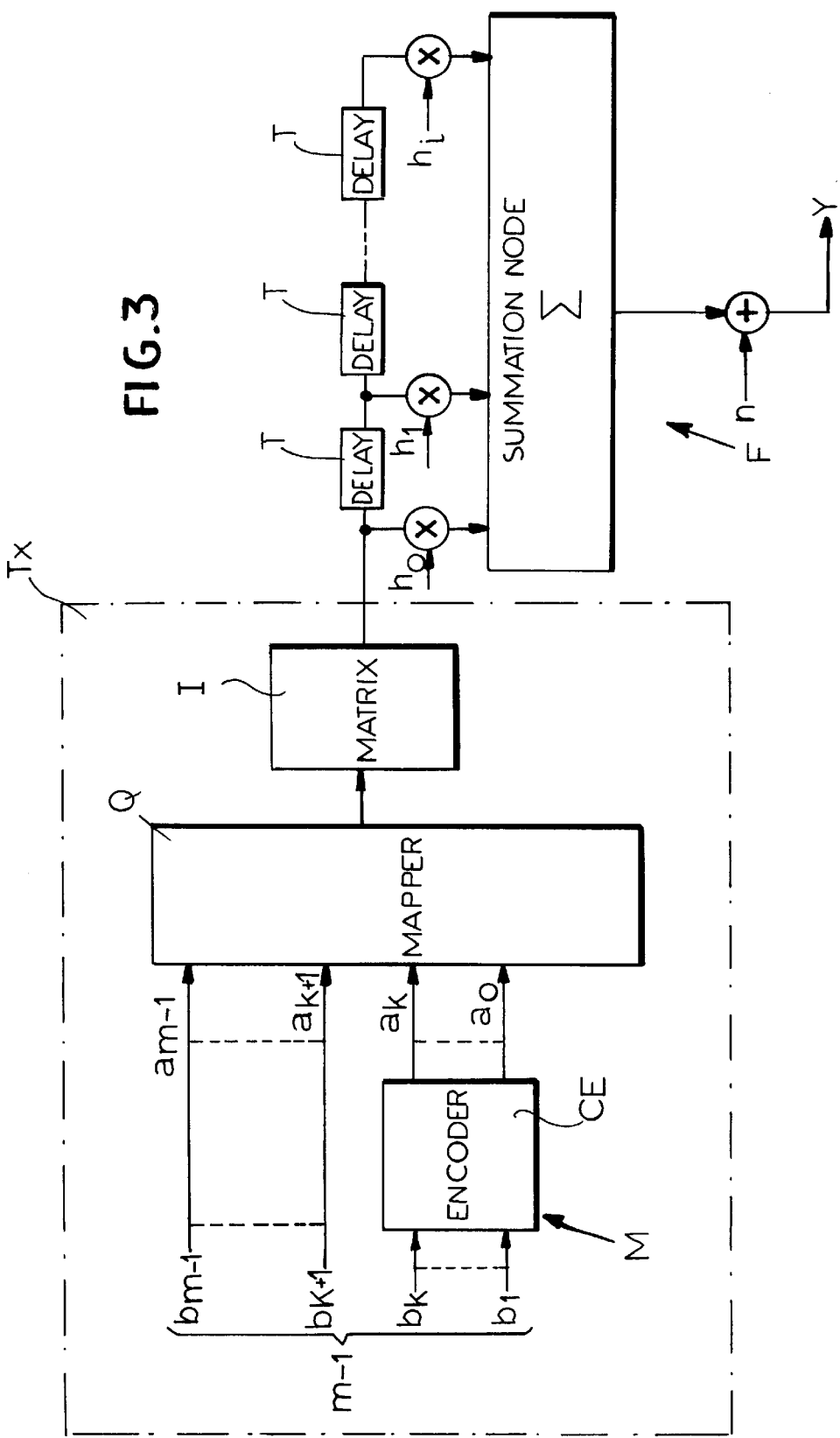
FIG. 3 shows a possible model to be used to described the operation of a TCM modulator and the behavior of the associated channel.

FIG. 3 shows how an encoder like encoder CE described above can be incorporated (within transmitter Tx in FIG. 1) in a TCM modulator, indicated in its entirety as M, in order to encode strings of m-1 outgoing symbols $b_i$ into strings of m coded symbols $a_i$, to be fed to a mapper Q, which is preferably followed by an interleaving matrix I.

The whole of the above description corresponds to widely known techniques, which do not need to be described in greater detail.

As can be better seen on the right side of FIG. 3, channel F affected by inter-symbol interference can essentially be modelled as a transversal filter with I delay elements T which represent the channel memory, and coefficients $h_0$, $h_1$, . . . , $h_I$, which express the manner in which interfering symbols interfere with each useful symbol, as a general summation represented by node Σ. At the output of summation node Σ, the term n, representing the noise (here assumed to be of the white Gaussian type) of the channel is superimposed on the signal. Thus signal Y is obtained, which represents the signal reaching receiver R.

This signal, received in correspondence with receiver R (FIG. 1), is demodulated in a first demodulating stage D (again, using widely known techniques, which do not require description here) and is brought back to a sequence of symbols belonging to the constellation, affected by inter-symbol interference. This sequence is fed to a decoding group essentially made up, in the example shown, by the cascade of two elements, i.e.:

a first Viterbi decoder 1 (about which more will be stated later) operating according to a soft detection scheme, that is, emitting not only decisions on the transmitted symbols, but also a measure of their reliability, and a second Viterbi decoder 2 (which can be made up of any conventional Viterbi decoder, able to process the symbols used for the transmission) to which the said signals are fed and which carries out the TCM decoding action, whereby a binary output signal is generated, representative of the initial signal fed to transmitter Tx.

When—as in the most preferred embodiment—the signal transmitted by transmitter Tx is subjected to interleaving (matrix I in FIG. 3), a deinterleaving device 3 is placed between the two Viterbi decoders 1, 2 and is intended to operate (according to known criteria) in a complementary way with respect to matrix I associated to the transmitter.

By way of further clarification, obvious to the skilled in the art, it should be noted that the various functional blocks referred to in FIGS. 2, 3 (parts pertaining to modulator M) and 4 can either be discrete processing blocks or, preferably, they can be incorporated in groups or as a whole into processing devices programmed specifically to carry out the described manipulation operations. This is particularly true for the two Viterbi decoders 1 and 2 illustrated in FIGS. 1 and 4. The criteria for programming such processing devices starting from the definition of their operating principles (see in particular FIG. 6A, 6B and 6C and the related description) and depending on the characteristics of the processing device itself and on the nature of the TCM signal transmitted on link L, can be defined by the skilled in the art by applying the normal technical skills required to carry out his/her work. A detailed description of such criteria is therefore totally superfluous here.

Figure 4:
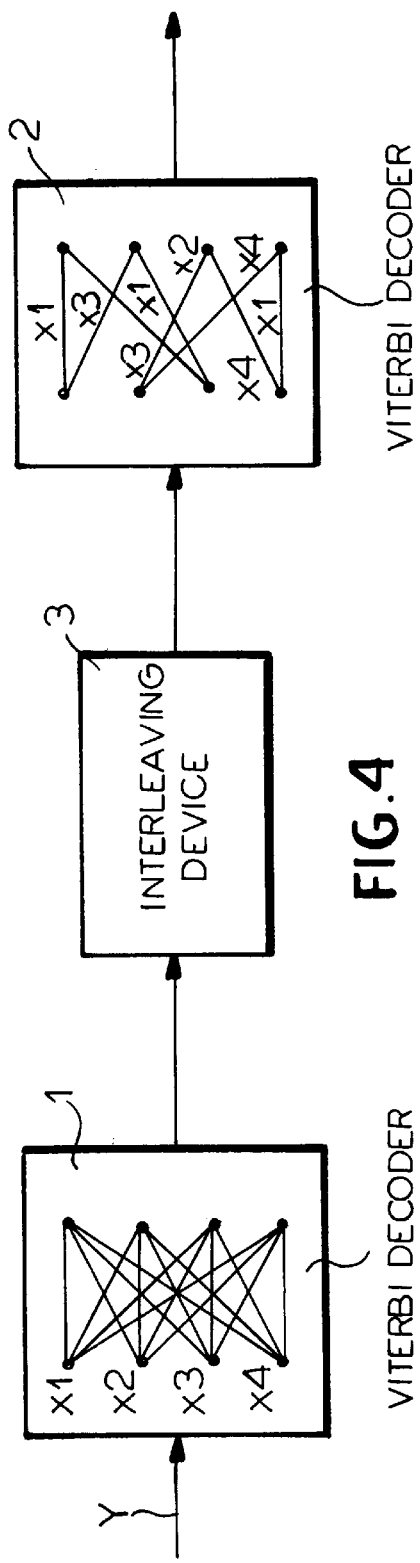
FIG. 4 is a block diagram depicting the functional structure of the two basic elements of the decoder employed in the device according to the invention.

In particular, the skilled in the art can readily understand how in the diagram shown in FIG. 4 the two Viterbi decoders 1 and 2 have been represented, according to common practice, by the respective trellises intended respectively to take into account i) the behavior of channel F - i.e. inter-symbol interference (decoder 1), and ii) the TCM coding scheme applied in transmission by modulator M (decoder 2).

In order to facilitate understanding of the operating and realisation criteria of the two Viterbi decoders labelled 1 and 2 in FIG. 2, it can be useful to provide here a brief description of the criteria upon which the operation of a Viterbi decoder functioning according to a soft output algorithm (SOVA) is based.

SOVA Operating Principles

SOVA is essentially a version of the Viterbi algorithm which, as seen previously, generates, in addition to a sequence of estimated symbols, also an indication of the reliability associated to each symbol. Thus it supplements the traditional Viterbi algorithm with a "soft" unit, which allows the decoder to identify the maximum likelihood path together with reliability information for each symbol.

Suppose in particular that there is a need to transmit an information sequence (the data), which can be expressed as $(a)_l^j = (a_1, \ldots, a_j)$ through an external coder, so as to produce sequence $(u)_l^n = (u_1, \ldots, u_n)$. An interleaving device transforms this sequence into sequence $(u')_l^n$ which in turn is sent to a noise-affected channel with memory. The noiseless version of the observed signal is indicated as $(x)_l^n$ and the signal observed at the channel output is $(y)_l^n$ where $$Y_k = X_k + v_k$$

and $(v)_l^n$ is a sequence of white Gaussian noise.

The SOVA detector emits (according to known criteria, which regulate the operation of the Viterbi decoder) a sequence of "hard" decisions $(\hat{u}')_l^n$ together with the sequence of their reliabilities $(L')_l^n$.

After deinterleaving, these two sequences are labelled $(\hat{u})_l^n$ and $(L)_l^n$, respectively. These sequences in turn are fed to an additional decoder which generates the final decisions $(\hat{a})_l^n$.

Assuming that the interleaver is sufficiently long, it can be safely assumed that the symbols $(\hat{u})_l^n$ have the same distribution they would have if they were received at the output of a memoryless discrete channel, with error probability $$p_k = P[\hat{u}_k \neq u_k | (y_k)_l^n]$$

For the sake of simplicity, it may be useful to refer first to the case of an antipodal binary modulation, with symbols +1 and +1. In this case the optimal metric for the second Viterbi decoder is $$\Sigma x_k^{(m)} \hat{u}_k \log \frac{1-p_k}{p_k}$$

where $x_k^{(m)} \in \{-1,+1\}^k$ is the k-th symbol of the m-th information sequence.

The reliability information provided by SOVA will be $$L_k = \log \frac{1-p_k}{p_k} \geq 0$$

In practice, the fist decoder (1 in FIGS. 1 and 4) provides the sequence $$\Lambda_k = \hat{u}_k \cdot L_k \qquad (1)$$

where the sign of $\Lambda_k$ provides the "hard" decision, while its amplitude provides the reliability information. The output of decoder 1 thus comprises a "hard" decision on the transmitted symbols and a reliability parameter.

Again referring for the sake of simplicity to the binary case, the output of decoder 1 can be seen as a filtered version of the input, where the amplitude of the output symbol is altered as a function of its reliability on the basis of preceding formula (I). Thus, unreliable symbols have output values near zero (small value of $L_k$ in formula I), while on the other hand the amplitude of reliable symbols is enhanced (these symbols have a high value of $L_k$).

Figure 5:
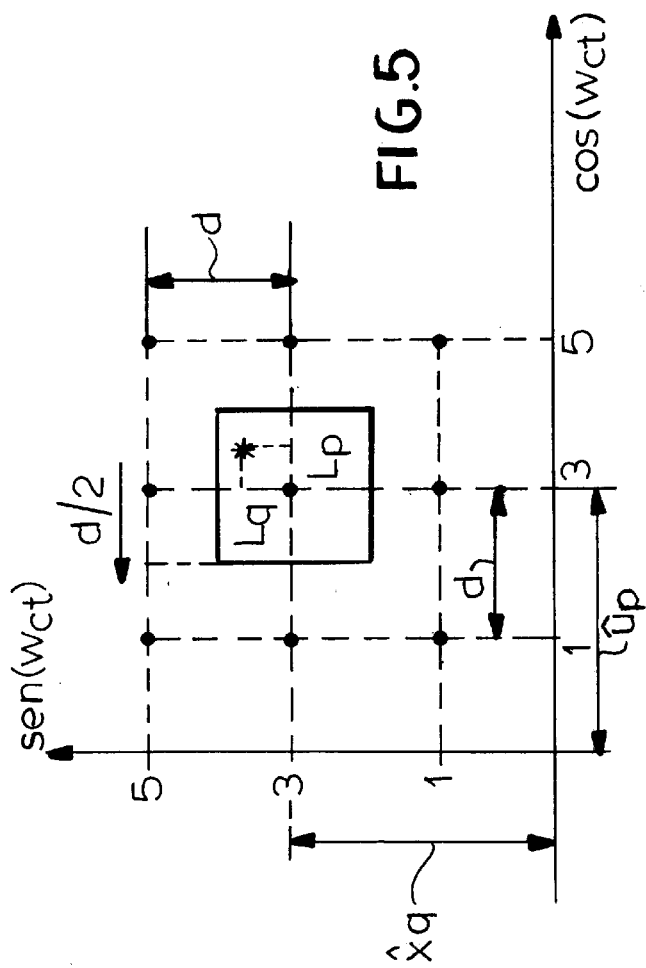
FIG. 5 illustrates in greater detail the demodulation operation carried out in the device according to the invention, FIGS. 6A, 6B and which comprises 3 parts, indicated respectively as 6A, 6B and 6C, are together a flow chart of the operation of one of the elements illustrated in FIG. 4.

A wholly similar principle applies to the non-binary case, i.e. when the quantities at the output of the demodulator are to be considered as belonging to a constellation having a number of states greater than 2 (e.g. QAM, as shown in the diagram in FIG. 5).

After separating the received symbol into its in-phase and quadrature components, decoder 1 computes two quantities $L_p$ and $L_q$ (p=in-phase; q=quadrature) which are related to the reliability of the hard output of the same decoder both in regard to direction x and to direction y.

Thus, referring to the diagram in FIG. 5, a value $L_p$ ($L_q$) near zero indicates a reliable real (imaginary) part, while a value near d/2 (obtained when the received point is close to the border of the decision region) indicates a completely unreliable symbol.

Therefore decoder 1 will emit a symbol S meant as a vector of the in-phase and quadrature parts and given by $$S_{pk} = \hat{u}_{pk} + L_{pk}$$

$$S_{qk} = \hat{u}_{qk} + L_{qk}$$

where $\hat{u}_{pk}$ and $\hat{u}_{qk}$ represent the "hard" decisions of decoder 1 in the k-th interval, while $L_{pk}$ and $L_{qk}$ represent the respective reliability parameters.

In the diagram shown in FIG. 5, "★" indicates a symbol used by decoder 1, while the lines indicated the borders of the region of decision.

From what has been stated, the range of variation of quantities $L_p$ and $L_q$ can easily be derived.

$$-d/2 \leq L_p \leq d/2$$

$$-d/2 \leq L_q \leq d/2$$

Of course, reliability values $L_p$ and $L_q$ must be updated for a certain number of symbol intervals (truncation length) to reach a good estimation of the degree of correctness of the hard decision.

Note that even if for the preceding relations reference is made to the output of the SOVA decoder, the hard decisions and the reliabilities are actually considered at the input of the second decoder.

The updating procedure comprises the following steps for each state of the inter-symbol interference (ISI):

computing the reliability value L of the most recently received symbol;

finding the path with the best metric (survivor path);
for any other path (concurrent path) leading to the state under consideration and for each position within the decision interval, comparing the respective hard decisions, distinguishing the two following cases:
if the hard decisions on the two paths coincide, the new reliabilities of the symbol belonging to the survivor path shall become:

$$L'_{ps} = \min \{L'_{ps}, L'_{pc} + \Delta_{cs}\}$$

$$L'_{qs} = \min \{L'_{qs}, L'_{qc} + \Delta_{cs}\}$$

where
s=survivor
c=concurrent
$\Delta_{cs}$=difference between the metrics of the surviving and concurrent paths
if the hard decisions on the two paths do not coincide, then the value of reliability pertaining to the direction along which the two decisions do not coincide is updated according to relation $$L'_{ps} = \min \{L'_{ps}, \Delta_{cs}\}$$

or $$L'_{qs} = \min \{L'_{qs}, \Delta_{cs}\}$$

Such updates are to be considered in modulus for what pertains to the absolute value of reliability, but with a sign for determination of the direction of displacement starting from the hard decision.

Subsequently, the best path is found which allows identifying the hard decision and the respective reliability values associated with it:

$$L_p = \text{sgn} \{L'_p\}\{d/2 - |L'_p|/2d\}$$

$$L_q = \text{sgn} \{L'_q\}\{d/2 - |L'_q|/2d\}$$

Figure 6A:
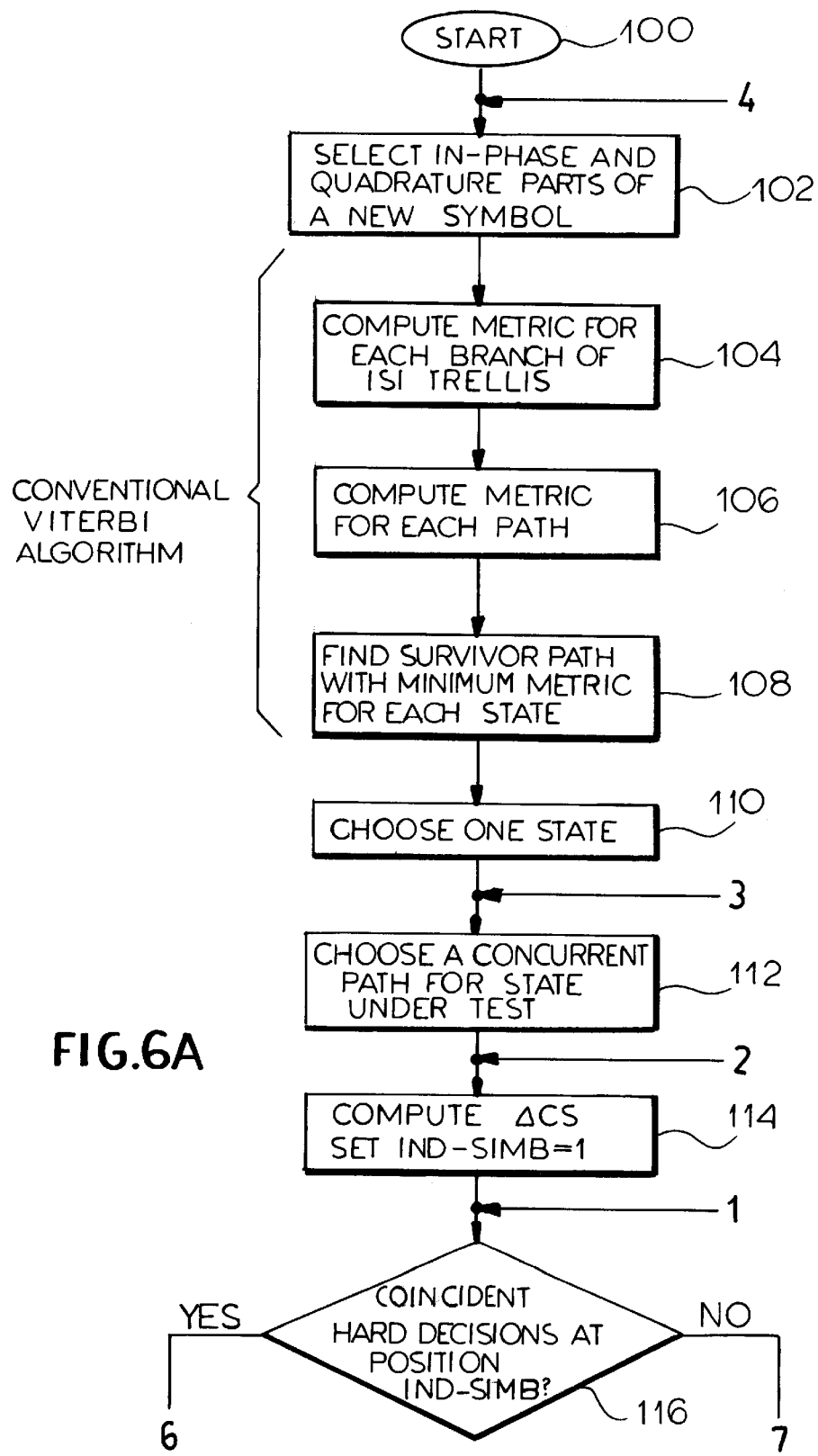
Figure 6B:
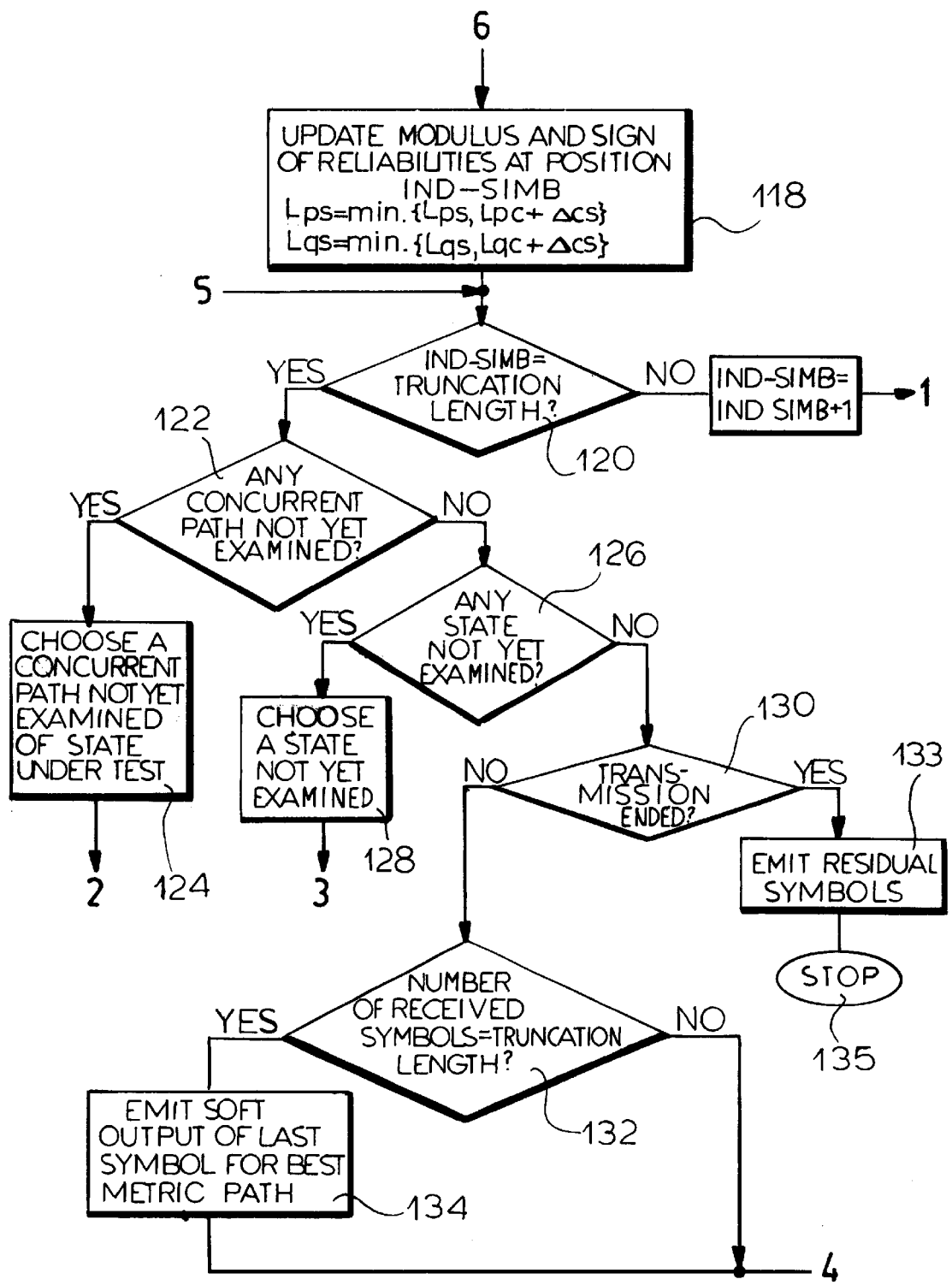
Figure 6C:
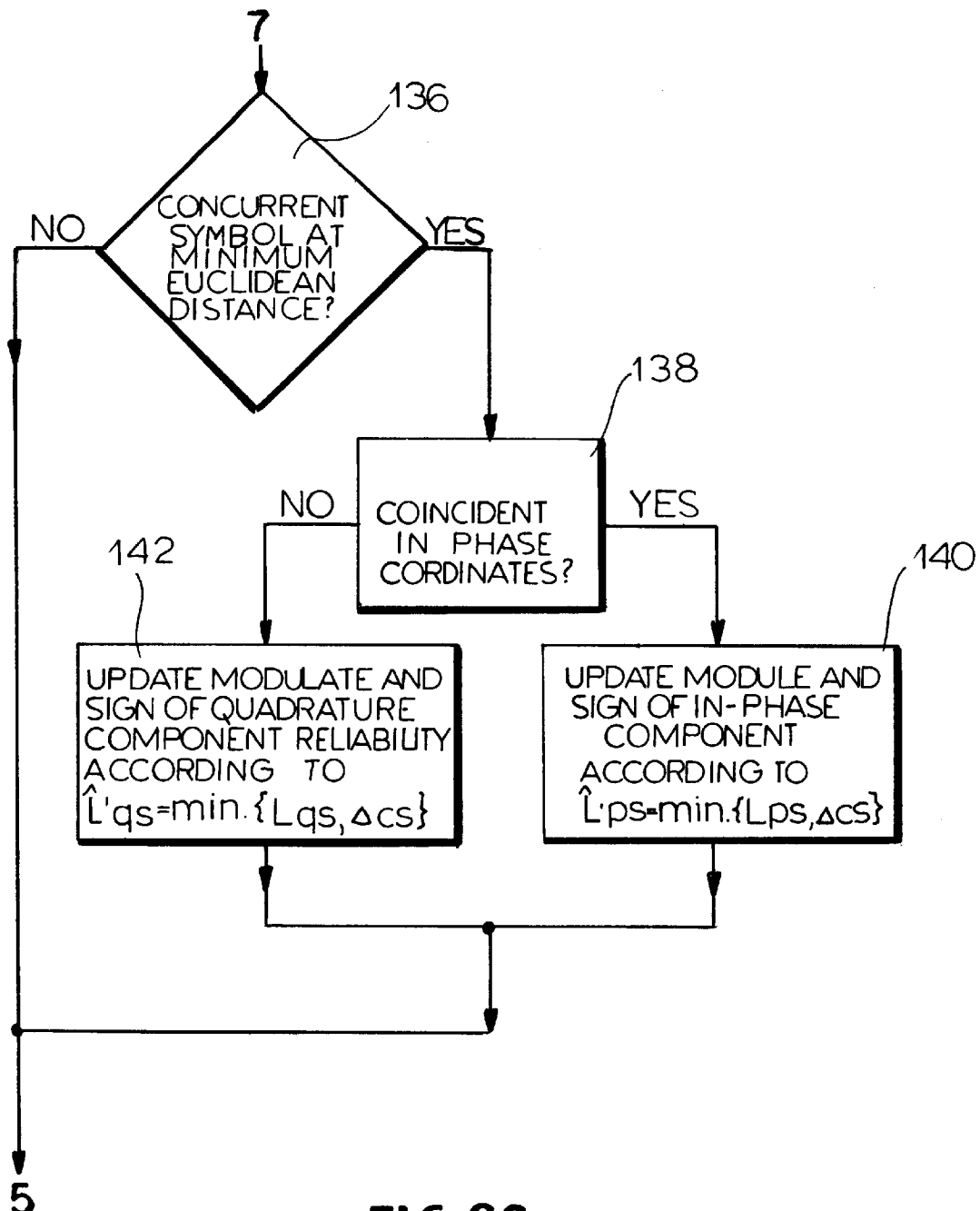

The flow chart shown in FIGS. 6A, 6B and 6C illustrates in greater detail how the method described above at the algorithm level is implemented in decoder 1 for each received symbol.

Starting from a start step 100, in step 102 decoder 1 selects the inphase and quadrature parts of the new received symbol; then in step 104 it calculates the associated metric for each branch of the trellis related to inter-symbol interference. In subsequent step 106, decoder 1 computes the metric associated to each path of the trellis, determining, in step 108, in relation to each state, the survivor path with minimum metric.

It will be appreciated that the sequence of steps from 104 to 108 corresponds to a classic Viterbi algorithm. Subsequently, after having chosen the survivor path in step 110, decoder 1 chooses, in step 112, a concurrent path of the state under examination to calculate in step 114 the quantity $\Delta_{cs}$ defined previously with specific reference to a unit value of quantity ind-simb, which takes into account the number of steps for which the analysis has been completed.

The next step, 116, is a choice step, where a check is made on whether the hard decisions on the two paths coincide or not.

In case of coincidence (positive outcome of the comparison) decoder 1 carries out the sequence of steps shown in FIG. 6B. In case of negative outcome, decoder 1 carries out the sequence of steps shown in FIG. 6C.

Examining first the sequence of steps in FIG. 6B (positive outcome of the comparison in step 116), in step 118 the decoder updates the reliability values $L_p$ and $L_p$ in modulus and sign, subsequently detecting in comparison step 120 whether the truncation length has been reached. In case of negative outcome, in step 122 quantity ind-simb is increased by one unit, and then return point 1 of the flow chart in FIG. 6A between steps 114 and 116 is reached.

In case of positive outcome of comparison step 120, decoder 1 moves to a further comparison step 122 where it checks whether there are any concurrent paths which have not been examined.

In case of positive outcome of comparison step 122, decoder 1 moves to step 124 where a concurrent path which has not yet been examined is chosen, then it returns to return point 2 between steps 112 and 114 of the part of the flow chart shown in FIG. 6A.

In case of negative outcome of comparison step 122 (all concurrent paths have been examined), decoder 1 ascertains in choice step 126 whether unexamined states still exist. In the affirmative, decoder 1 moves to step 128, chooses a state which has not yet been examined and returns to the flow chart in FIG. 6A in correspondence with return point 3 between steps 110 and 112. If the test in step 126 has a negative outcome, decoder 1 moves to an additional test step 130 where it ascertains whether the transmission has finished.

In the negative, in a subsequent step 132 the decoder checks whether a number of symbols equal to the truncation length has been received. In case of positive outcome, decoder 1 moves to a subsequent step 134 where decoder 1 itself emits on the soft output towards decoder 2 (more precisely towards deinterleaving matrix labelled as 3 in FIG. 4) the signal related to the soft output pertaining to the last symbol with respect to the path with the best metric.

At this point, decoder 1 returns to return point 4 of the flow chart of FIG. 6A, getting ready to decode a new symbol. Such return upstream of step 102 occurs directly starting from test step 132, without going through step 134, if the test in step 132 yields a negative outcome.

In case of positive outcome of the test in step 130 (situation which corresponds to the fact that the transmission has been terminated), decoder 1 proceeds (step 133) to emit the residual symbols, then moving to a stop condition (step 135).

With reference to the part of the flow chart illustrated in FIG. 6C, if the test in step 116 yields a negative result, decoder 1 moves to step 136. Here, an additional test is carried out to ascertain whether the concurrent symbol is at a minimum Euclidean distance.

In case of negative outcome, the decoder moves to return point 5 of the flow chart in FIG. 6B, between steps 118 and 120 described above.

In case of positive outcome of the test in step 136, decoder 1 moves to a further test step 138 where it verifies whether the in-phase co-ordinate related to the concurrent symbol found to be at minimum Euclidean distance coincides or not.

Depending on the outcome of the test in step 138, decoder 1 moves, in case of positive outcome, to step 140 and, in case of negative outcome, to step 142. In both steps 140 and 142 the reliability is updated, with the difference that, in the case of step 140, the module and the sign on the inphase component $L'_{ps}$ are updated, in the terms recalled previously. In step 142, the quadrature component is instead updated, also operating in module and sign. Regardless of the path followed (step 140 or step 142), decoder 1 subsequently moves to return point 5 in FIG. 6B.

Figure 7:
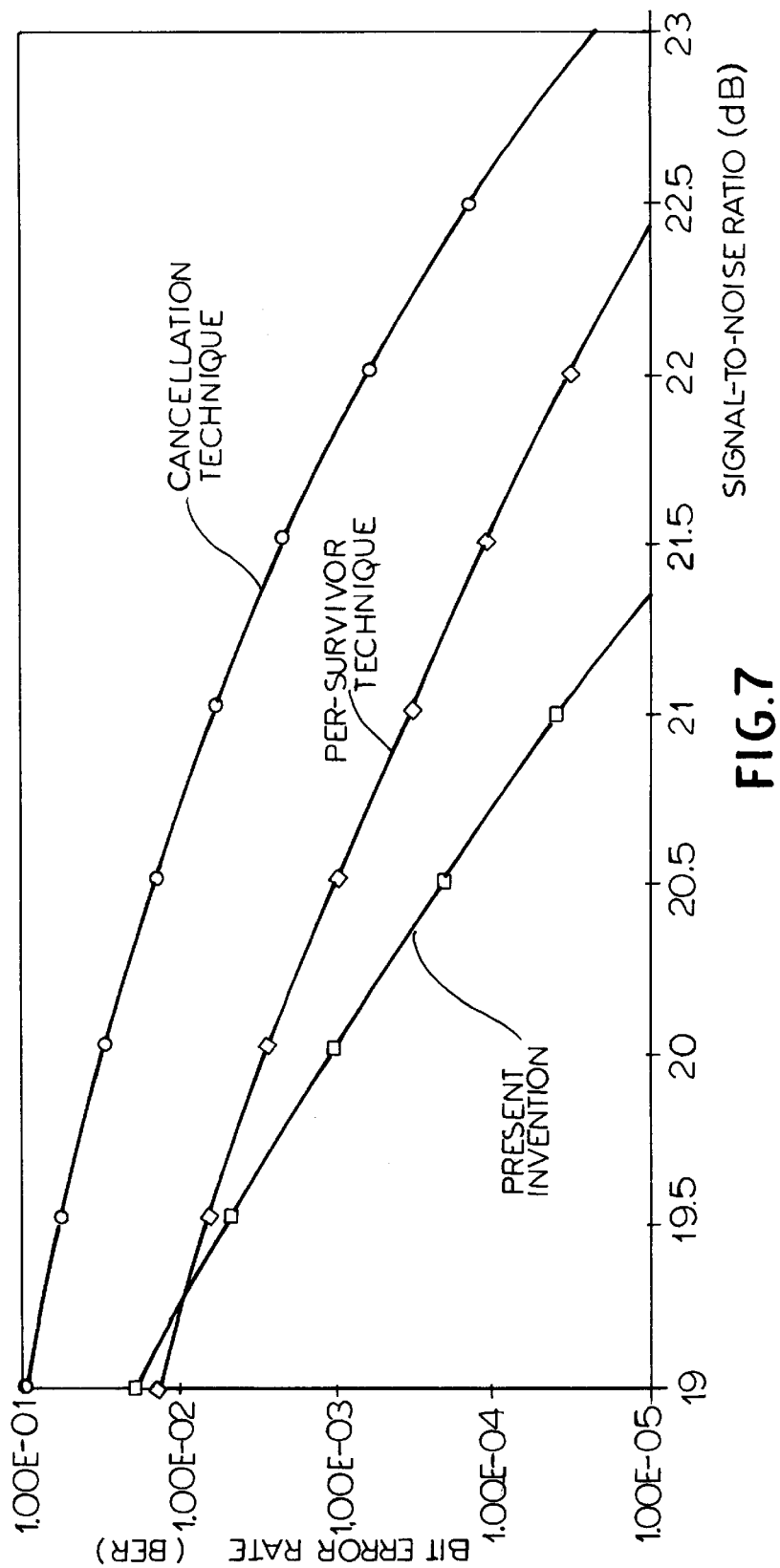
FIG. 7 is a diagram depicting the performance of a transmission system operating according to the invention.

The diagram in FIG. 7 shows the performance of the method and of the device according to the invention by comparison with two different prior art solutions. The diagram in FIG. 7 shows the Bit Error Rate (BER), plotted along y axis, versus the signal-to-noise ratio (in dB) plotted along x axis.

In particular, the curve relevant to the solution according to the invention is the lowermost one. The uppermost curve, identified by circle markers, refers to cancellation technique of the type described in the work by E. Biglieri, G. Caire and G. D'Aria mentioned in the introductory part of the description. The curve in the middle, identified by diamond-shaped markers, expresses instead the performance measured using a per-survivor technique of the type described in the work by R. Raheli, A. Polydoros and C. K. Tzou, mentioned in the introductory part of the description.

The comparisons were carried out in homogeneous conditions, i.e. by utilising the same type of TCM modulation with reference to the same type of constellation recalled previously (128 QAM), with an eight state 4D-TCM encoder and 6.5 bits symbol.

Of course, given the principle of the invention, the details and the forms for its realization may vary widely with respect to what has been described and illustrated, without departing from the scope of the present invention. For instance, although reference has been made previously, by way of example, to TCM modulation, the invention may be applied to any type of coded modulation representable with a trellis diagram, such as BCM (Block Coded Modulation), MLCM (Multi-Level Coded Modulation).

I claim:

1. A method for the reception of digital signals which have undergone a coded modulation representable by means of a trellis diagram, and which are transmitted on a channel with memory, so that a received digital signal is affected by inter-symbol interference, comprising the steps of submitting said received digital signal to:

a first Viterbi decoding step, so as to generate a respective soft output ($S_{pk}$, $S_{qk}$) including, for each symbol, a pair of components comprising a decision on a transmitted symbol ($\hat{U}_{pk}$, $\hat{U}_{qk}$), and a reliability parameter ($L_{pk}$, $L_{qk}$), said first Viterbi decoding step taking into account the effect of the memory of said channel, and a second Viterbi decoding step carried out on said soft output, said second Viterbi decoding step taking into account said coded modulation, said first Viterbi decoding step including the following operations:

determining the reliability parameter of the most recent received symbol;

searching a path with a best metric within a trellis of the first Viterbi decoding step;

for any other path of said trellis which leads to a state under examination and for any position within a decision interval, comparing respective hard decisions and proceeding in such a way that:

i) if the hard decisions on the two paths coincide, new reliabilities of the symbol belonging to the survivor path are defined, and ii) if the hard decisions on the two paths do not coincide, the reliability parameters related to a direction along which the two decisions do not coincide are updated; and obtaining a best survivor path and identifying the hard decision and the respective reliability parameter value associated with it.

2. The method defined in claim 1 which further comprises a deinterleaving step of the received signal carried out between said first and said second Viterbi decoding steps.

3. The method defined in claim 1 wherein said coded digital signals are transmitted in a QAM constellation.

4. The method defined in claim 1 wherein said first Viterbi decoding step is carried out by deriving, for respective outputs, in-phase and quadrature components both for said decision on the transmitted symbol ($\hat{U}_{pk}$, $\hat{U}_{qk}$), and for said reliability parameter ($L_{pk}$, $L_{qk}$).

5. A device for the reception of digital signals which have undergone a coded modulation representable by means of a trellis diagram and are transmitted on a channel with memory, so that a received digital signal is affected by inter-symbol interference, comprising:

a first Viterbi decoder which receives said digital signal and generates, starting from it, a respective soft output ($S_{pk}$, $S_{qk}$) including, for each symbol, a pair of components comprising a decision on a transmitted symbol ($\hat{U}_{pk}$, $\hat{U}_{qk}$) and a reliability parameter ($L_{pk}$, $L_{qk}$), said first Viterbi decoder taking into account the memory effect of such channel, and a second Viterbi decoder fed with said soft output, said second Viterbi decoder taking into account said coded modulation, said first Viterbi decoding step including the following operations:

determining the reliability parameter of the most recent received symbol;

searching a path with a best metric within a trellis of the first Viterbi decoding step;

for any other path of said trellis which leads to a state under examination and for any position within a decision interval, comparing respective hard decisions and proceeding in such a way that:

i) if the hard decisions on the two paths coincide, new reliabilities of the symbol belonging to the survivor path are defined, and ii) if the hard decisions on the two paths do not coincide, the reliability parameters related to a direction along which the two decisions do not coincide are updated; and obtaining a best survivor path and identifying the hard decision and the respective reliability parameter value associated with it.

6. The device defined in claim 5, further comprising a deinterleaving unit connected between said first and said second Viterbi decoders.

7. The device defined in claim 5 which is configured to receive digital signals coded by a QAM constellation.

8. The device defined in claim 5 wherein said first Viterbi decoder derives, for said respective output, in-phase and quadrature components both for said decision on the transmitted signal ($\hat{U}_{pk}$, $\hat{U}_{qk}$) and for said reliability parameter ($L_{pk}$, $L_{qk}$).

* * * * *